United States Patent
Tomioka et al.

(10) Patent No.: US 9,425,388 B2
(45) Date of Patent: Aug. 23, 2016

(54) MAGNETIC ELEMENT AND METHOD OF MANUFACTURING THE SAME

(71) Applicants: Kazuhiro Tomioka, Seoul (KR); Satoshi Seto, Seoul (KR); Masatoshi Yoshikawa, Seoul (KR)

(72) Inventors: Kazuhiro Tomioka, Seoul (KR); Satoshi Seto, Seoul (KR); Masatoshi Yoshikawa, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/200,429

(22) Filed: Mar. 7, 2014

(65) Prior Publication Data

US 2015/0069549 A1  Mar. 12, 2015

Related U.S. Application Data

(60) Provisional application No. 61/877,257, filed on Sep. 12, 2013.

(51) Int. Cl.
*H01L 43/12* (2006.01)
*H01L 43/08* (2006.01)
*H01L 27/22* (2006.01)

(52) U.S. Cl.
CPC ............... *H01L 43/12* (2013.01); *H01L 43/08* (2013.01); *H01L 27/228* (2013.01)

(58) Field of Classification Search
CPC ........... H01L 29/785; H01L 29/66795; H01L 29/165; H01L 27/222; H01L 43/08
See application file for complete search history.

(56) References Cited

U.S. PATENT DOCUMENTS

| 6,483,675 | B1 | 11/2002 | Araki et al. |
| 6,984,529 | B2 | 1/2006 | Stojakovic et al. |
| 7,015,524 | B2 | 3/2006 | Ikeda |
| 7,060,194 | B2 | 6/2006 | Kodaira et al. |
| 8,716,034 | B2 | 5/2014 | Ohsawa et al. |
| 8,928,055 | B2 * | 1/2015 | Saida et al. .................... 257/295 |
| 2004/0222185 | A1 | 11/2004 | Kawai |
| 2006/0056115 | A1 | 3/2006 | Djayaprawira et al. |
| 2007/0195592 | A1 | 8/2007 | Yuasa |
| 2008/0055793 | A1 | 3/2008 | Djayaprawira et al. |

(Continued)

FOREIGN PATENT DOCUMENTS

| JP | 10-041308 A | 2/1998 |
| JP | 2005-314791 A | 11/2005 |

(Continued)

OTHER PUBLICATIONS

U.S. Appl. No. 14/200,510; First Named Inventor: Kazuhiro Tomioka; Title: "Method of Manufacturing Magnetoresistive Element", filed Mar. 7, 2014.

(Continued)

*Primary Examiner* — Matthew Reames
*Assistant Examiner* — Vincent Wall
(74) *Attorney, Agent, or Firm* — Holtz, Holtz & Volek PC

(57) ABSTRACT

A magnetic element includes a first magnetic layer, a first non-magnetic layer on the first magnetic layer, a second magnetic layer on the first non-magnetic layer, a second non-magnetic layer on the second magnetic layer, and a third magnetic layer on the second non-magnetic layer, the third magnetic layer having a side wall layer including a material which is included in the second non-magnetic layer; wherein the material is one of Ru and Pt as a common material to the side wall layer and the second non-magnetic layer.

9 Claims, 17 Drawing Sheets

(56) References Cited

U.S. PATENT DOCUMENTS

| | | |
|---|---|---|
| 2008/0124454 A1 | 5/2008 | Djayaprawira et al. |
| 2008/0180862 A1 | 7/2008 | Djayaprawira et al. |
| 2010/0097846 A1 | 4/2010 | Sugiura et al. |
| 2010/0181632 A1 | 7/2010 | Yuasa |
| 2010/0304504 A1 | 12/2010 | Shinde et al. |
| 2011/0031570 A1 | 2/2011 | Yuasa |
| 2011/0094875 A1 | 4/2011 | Djayaprawira et al. |
| 2012/0139019 A1 | 6/2012 | Iba |
| 2012/0161262 A1 | 6/2012 | Yuasa |
| 2012/0193693 A1 | 8/2012 | Kanaya |
| 2012/0244641 A1 | 9/2012 | Tomioka |
| 2013/0017626 A1 | 1/2013 | Tomioka |
| 2013/0098868 A1 | 4/2013 | Nishimura et al. |
| 2013/0228883 A1 | 9/2013 | Yuasa |
| 2014/0087485 A1 | 3/2014 | Tomioka |
| 2014/0227804 A1 | 8/2014 | Hsu et al. |
| 2014/0284733 A1 | 9/2014 | Watanabe et al. |

FOREIGN PATENT DOCUMENTS

| | | |
|---|---|---|
| JP | 2005-340260 A | 12/2005 |
| JP | 2006-278457 A | 10/2006 |
| WO | WO 2011/030529 A1 | 3/2011 |

OTHER PUBLICATIONS

U.S. Appl. No. 14/201,108; First Named Inventor: Satoshi Inada; Title: "Method of Manufacturing Magnetoresistive Element", filed Mar. 7, 2014.

Jun Hayakawa, et al.: "Dependence of Giant Tunnel Magnetoresistance of Sputtered CoFeB/MgO/CoFeB Magnetic Tunnel Junctions on MgO Barrier Thickness and Annealing Temperature", Japanese Journal of Applied Physics, vol. 44, No. 19, Apr. 22, 2005, pp. L587 to L589 (in English).

U.S. Appl. No. 14/026,397; First Named Inventor: Kazuhiro Tomioka; Title: Semiconductor Device Manufacturing Method, filed Sep. 13, 2013.

\* cited by examiner

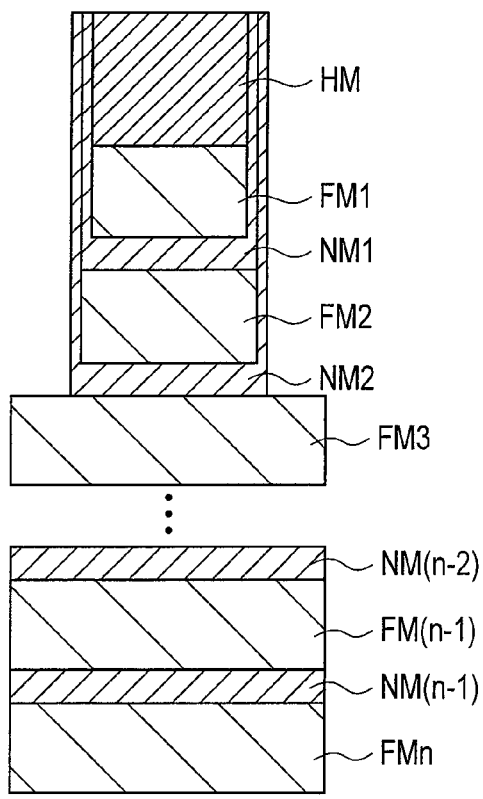
F I G. 5
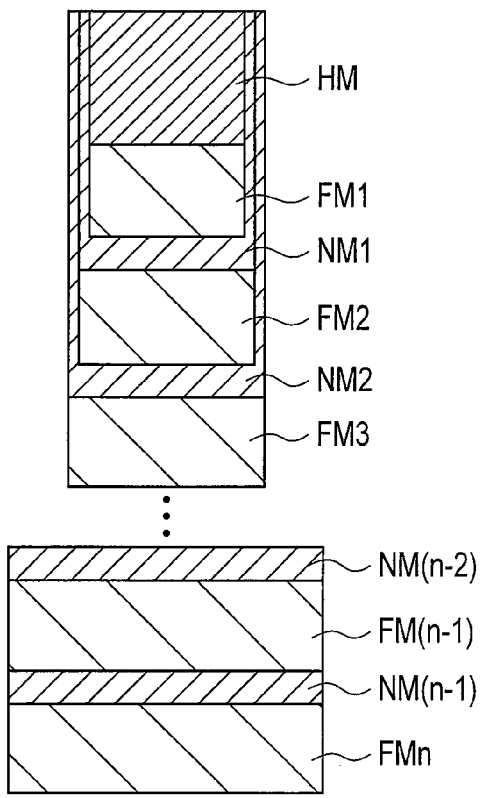
F I G. 6

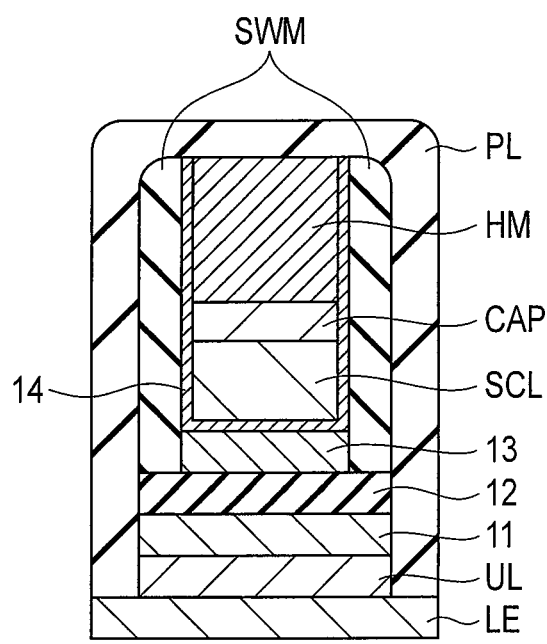
F I G. 7
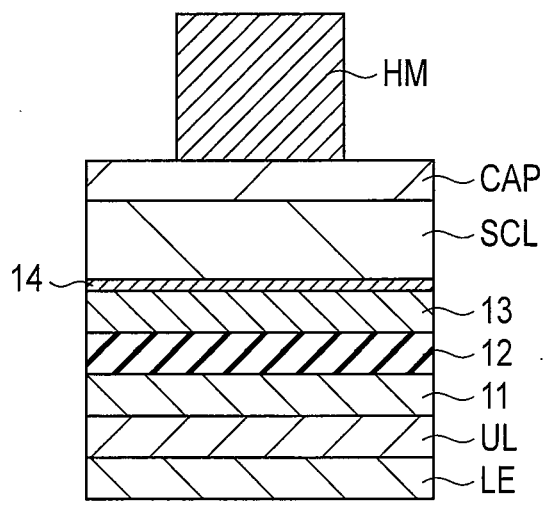
F I G. 8

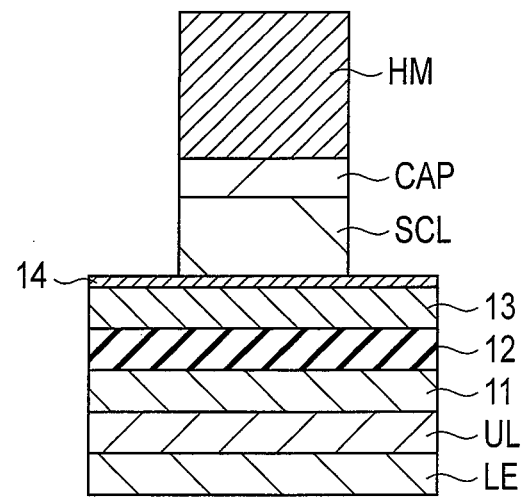
F I G. 9
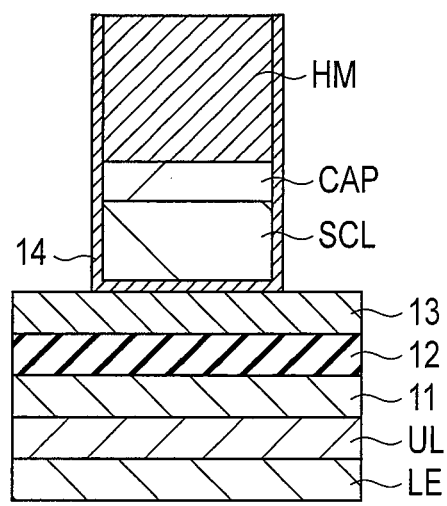
F I G. 10

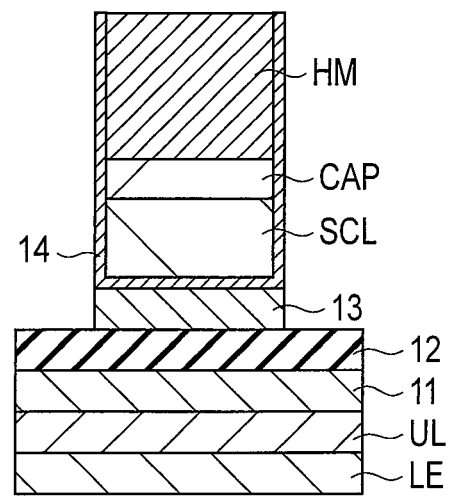
F I G. 11
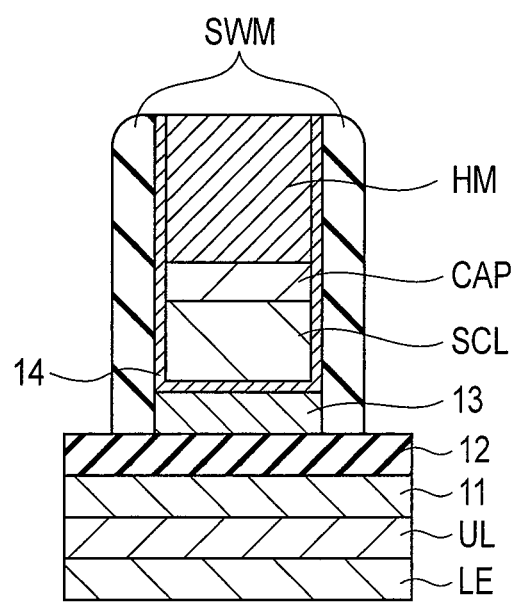
F I G. 12

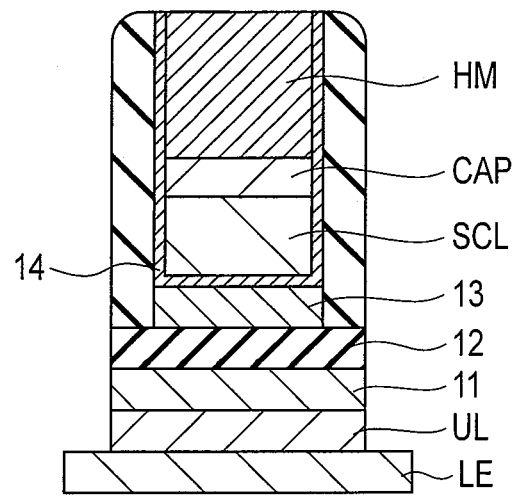
F I G. 13
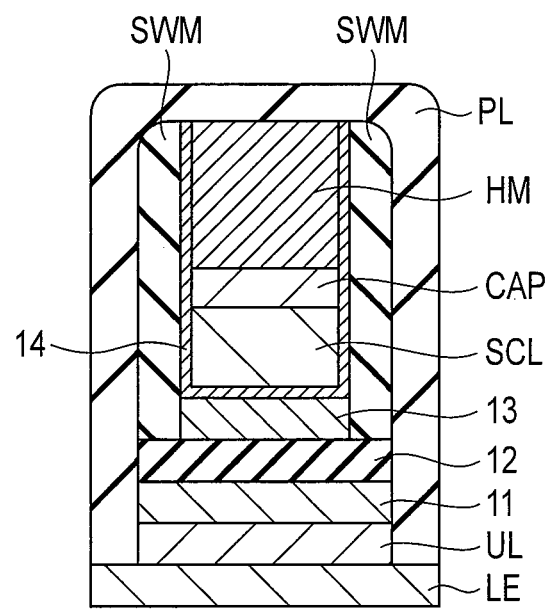
F I G. 14

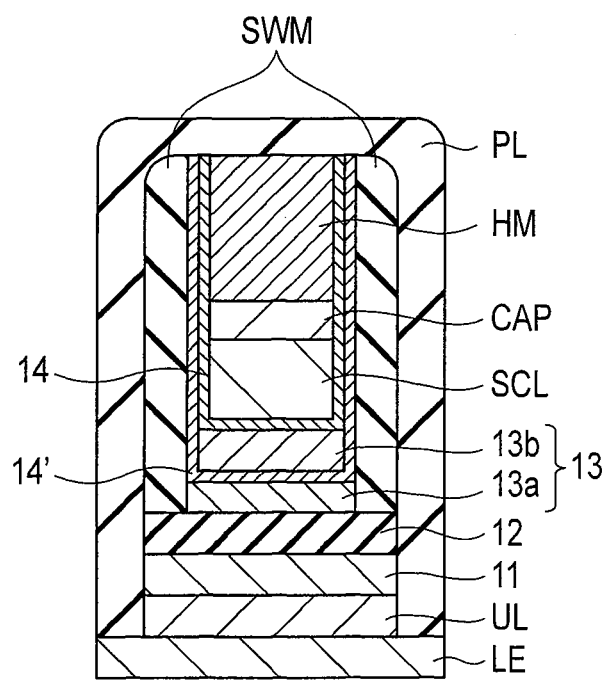
F I G. 15
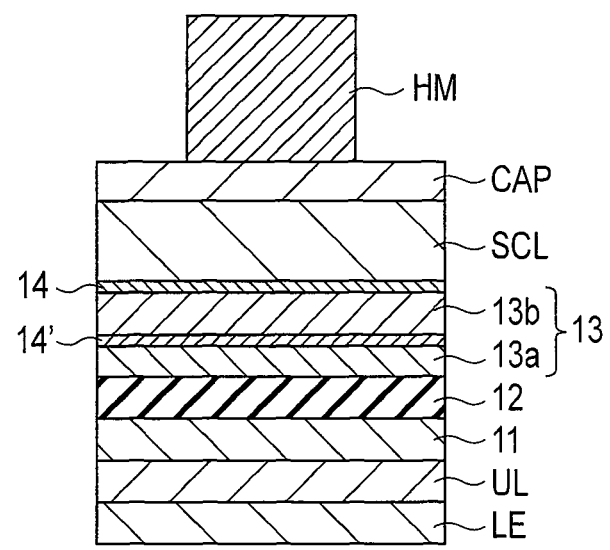
F I G. 16

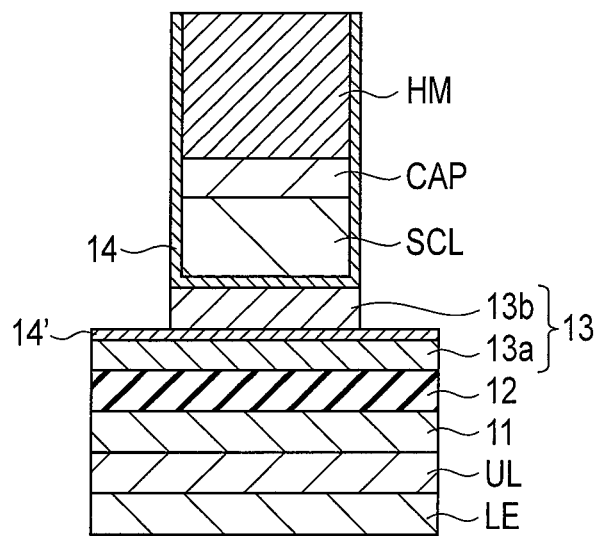
F I G. 19
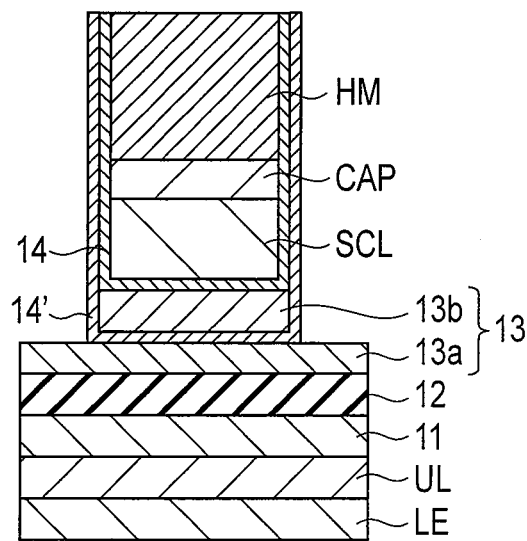
F I G. 20

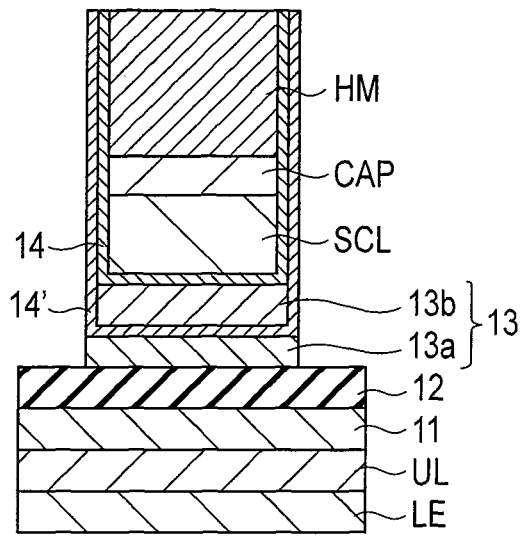
F I G. 21
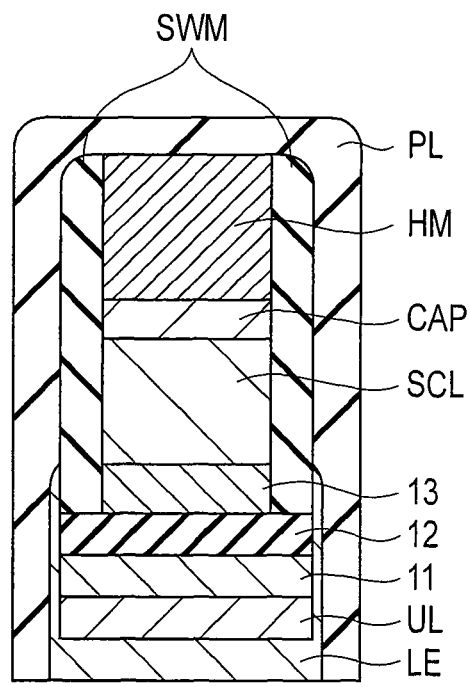
F I G. 22

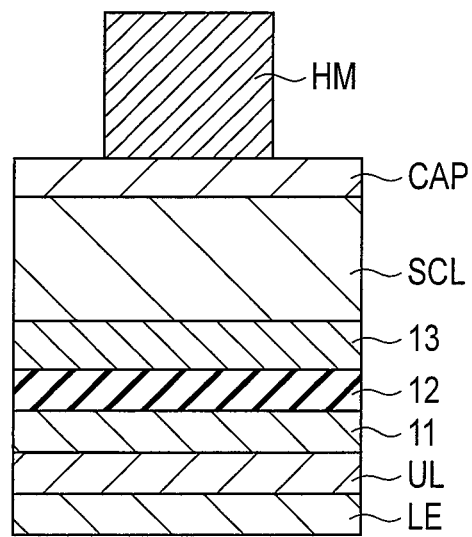
F I G. 23
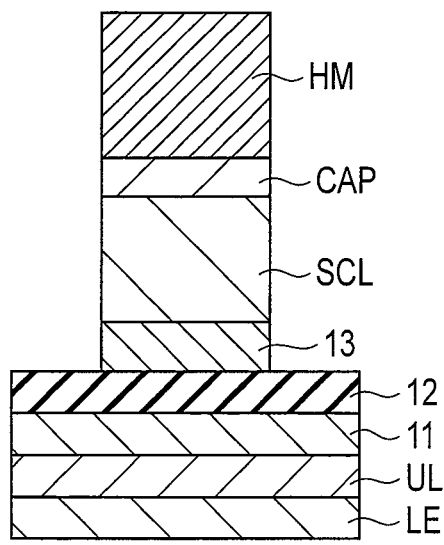
F I G. 24

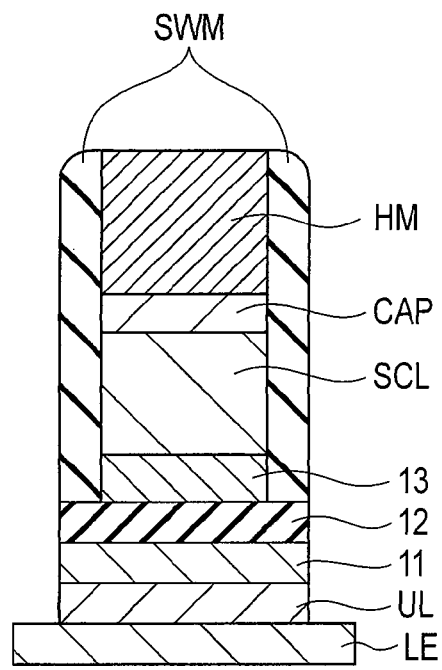
F I G. 25
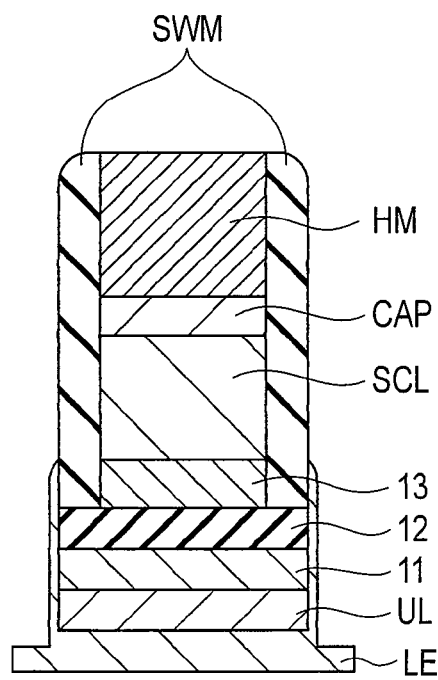
F I G. 26

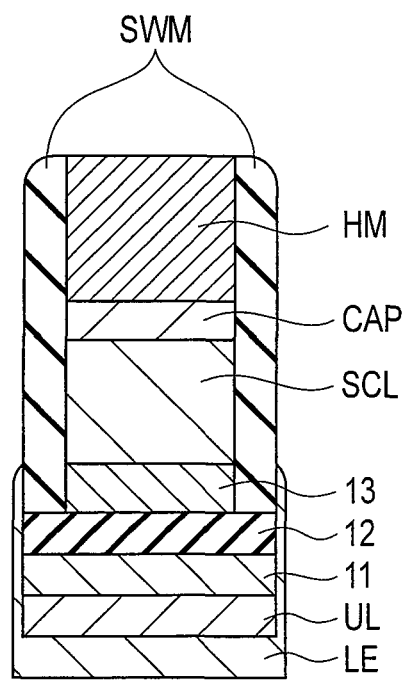
F I G. 27
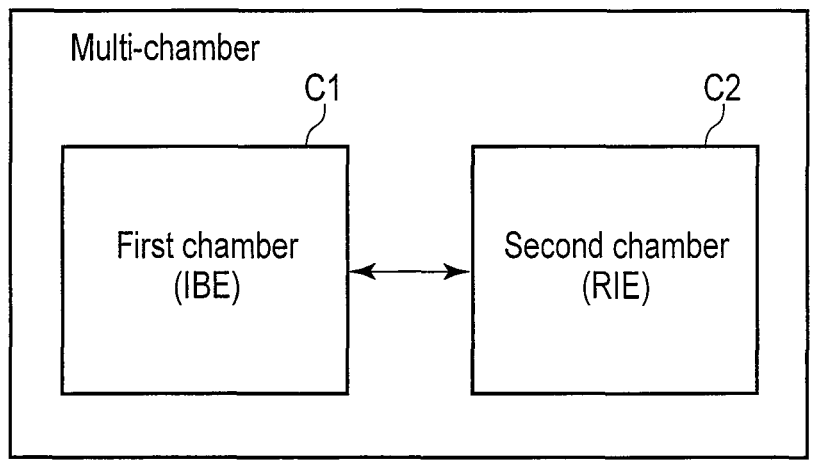
F I G. 28

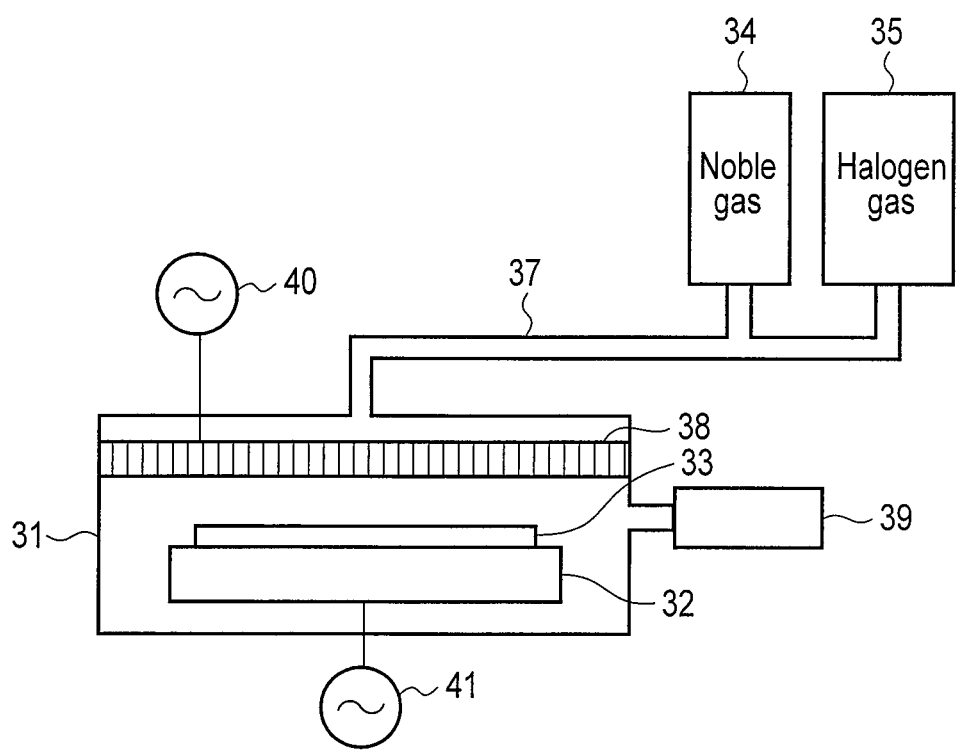
F I G. 29

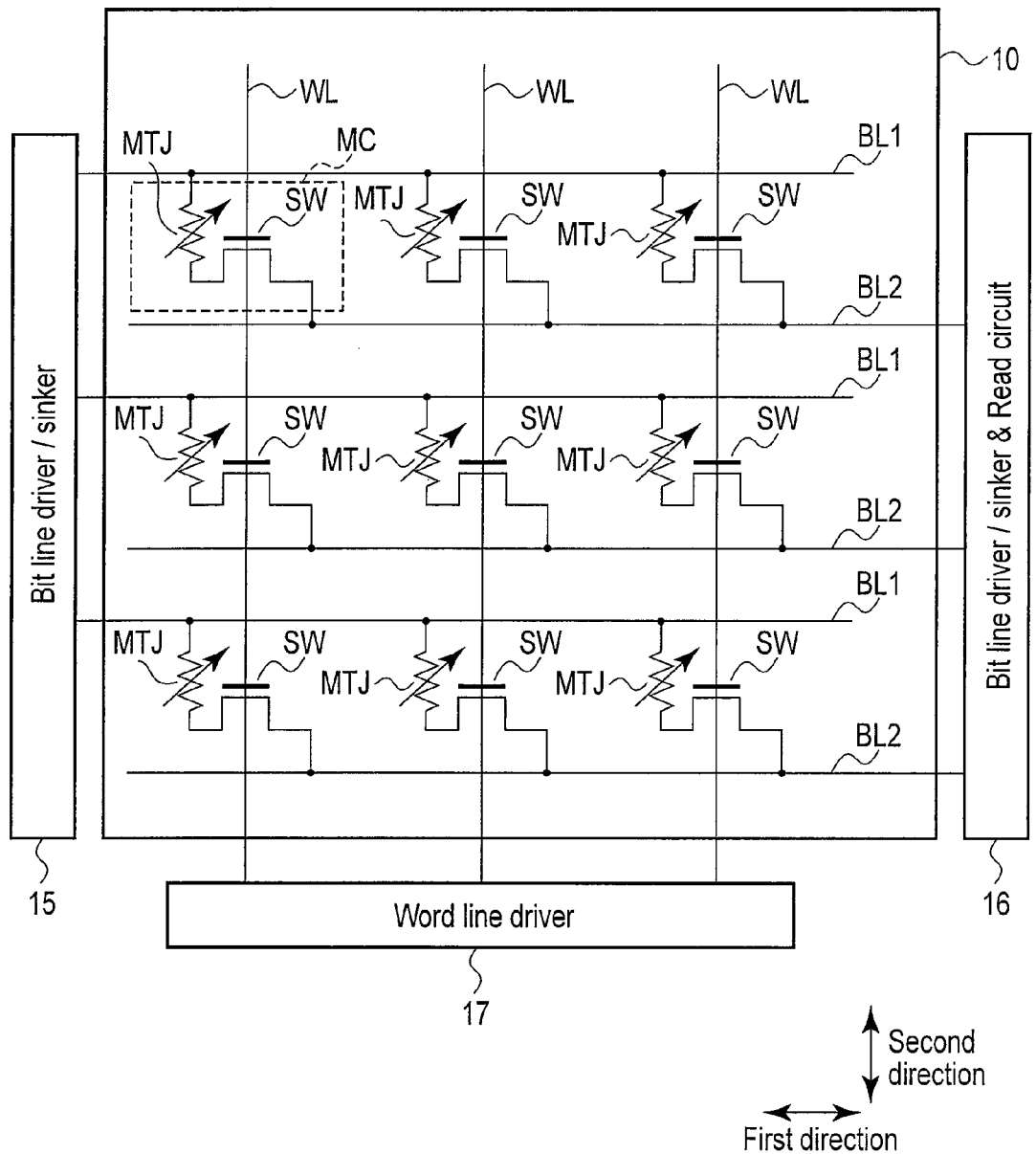
F I G. 30

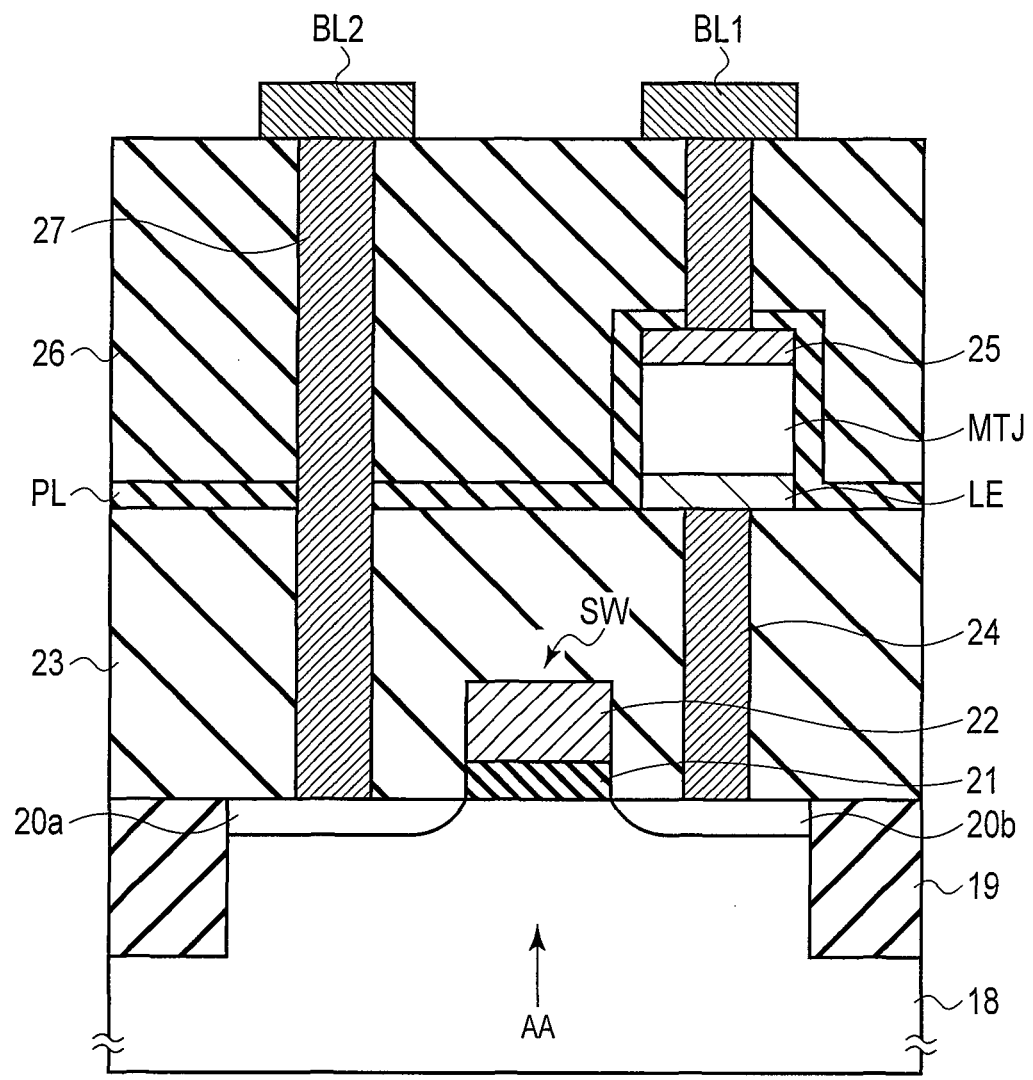
F I G. 31

MAGNETIC ELEMENT AND METHOD OF MANUFACTURING THE SAME

CROSS-REFERENCE TO RELATED APPLICATIONS

This application claims the benefit of U.S. Provisional Application No. 61/877,257, filed Sep. 12, 2013, the entire contents of which are incorporated herein by reference.

FIELD

Embodiments described herein relate generally to a magnetic element and a method of manufacturing the same.

BACKGROUND

An MRAM (magnetic random access memory) chip employed as a nonvolatile semiconductor storage uses a magnetoresistive element as a storage element. The magnetoresistive element has a structure in which a tunnel barrier layer (non-magnetic layer) is sandwiched between a storage layer (magnetic layer) and a reference layer (magnetic layer). In addition, data is stored in parallel (same) or anti-parallel (opposite) magnetizing directions in the storage layer and the reference layer.

Recently, writing of data, i.e., magnetization reversal in the storage layer has been generally executed in what is called Spin Transfer Torque (STT). In addition, data has been read by passing a perpendicular current to a film surface in a multilayered structure of the magnetoresistive element. Directions of residual magnetization in the storage layer and the reference layer are perpendicular to the film surface (i.e., perpendicular magnetization) or parallel to the film surface (i.e., in-plane magnetization).

BRIEF DESCRIPTION OF THE DRAWINGS

FIG. 1 to FIG. 6 are cross-sectional views showing an example of a manufacturing method according to First Embodiment;

FIG. 7 is a cross-sectional view showing an example of a magnetoresistive element;

FIG. 8 to FIG. 14 are cross-sectional views showing an example of a manufacturing method according to Second Embodiment;

FIG. 15 is a cross-sectional view showing an example of a magnetoresistive element;

FIG. 16 to FIG. 21 are cross-sectional views showing an example of a manufacturing method according to Third Embodiment;

FIG. 22 is a cross-sectional view showing an example of a magnetoresistive element;

FIG. 23 to FIG. 27 are cross-sectional views showing an example of a manufacturing method according to Fourth Embodiment;

FIG. 28 is a block diagram showing an example of a multi-chamber;

FIG. 29 is an illustration showing an example of a manufacturing apparatus executing RIE;

FIG. 30 is a block diagram showing an example of a magnetic random access memory; and FIG. 31 is a cross-sectional view showing an example of a memory cell.

DETAILED DESCRIPTION

In general, according to one embodiment, a magnetic element comprises: a first magnetic layer; a first nonmagnetic layer on the first magnetic layer; a second magnetic layer on the first nonmagnetic layer; a second nonmagnetic layer on the second magnetic layer; and a third magnetic layer on the second nonmagnetic layer, the third magnetic layer having a sidewall comprising a material which is included in the second nonmagnetic layer.

The embodiments will be hereinafter described with reference to the accompanying drawings.

(First Embodiment)

FIG. 1 to FIG. 6 show a manufacturing method according to First Embodiment.

Figure 1:
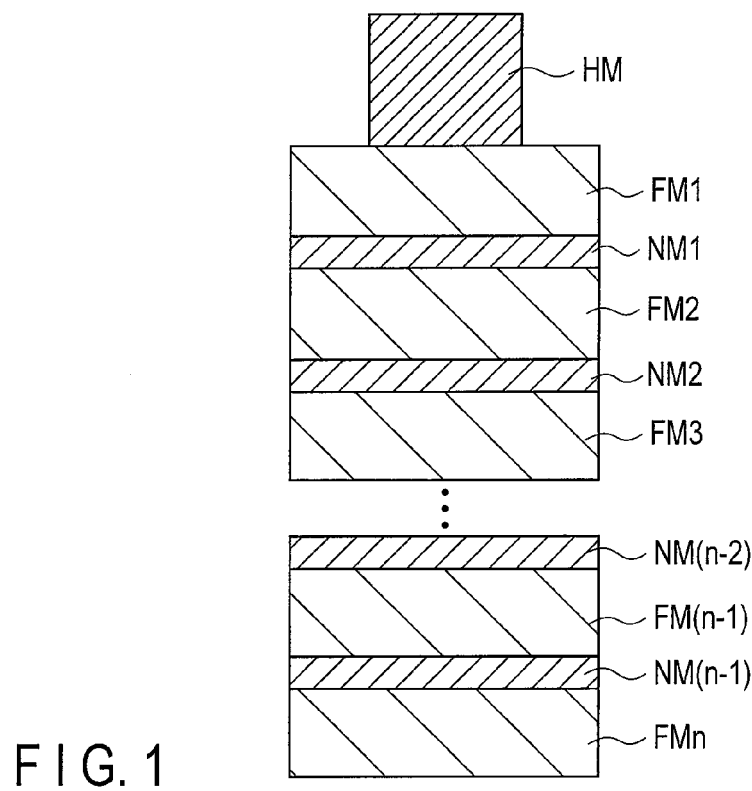

First, a structure in which magnetic layers FM1, FM2, . . . FMn and non-magnetic layers NM1, NM2, . . . NM(n−1) are stacked alternately is formed as shown in FIG. 1. In addition, mask layer (for example, a hard mask layer of silicon oxide, silicon nitride, etc.) HM is formed on uppermost magnetic layer FM1.

Figure 2:
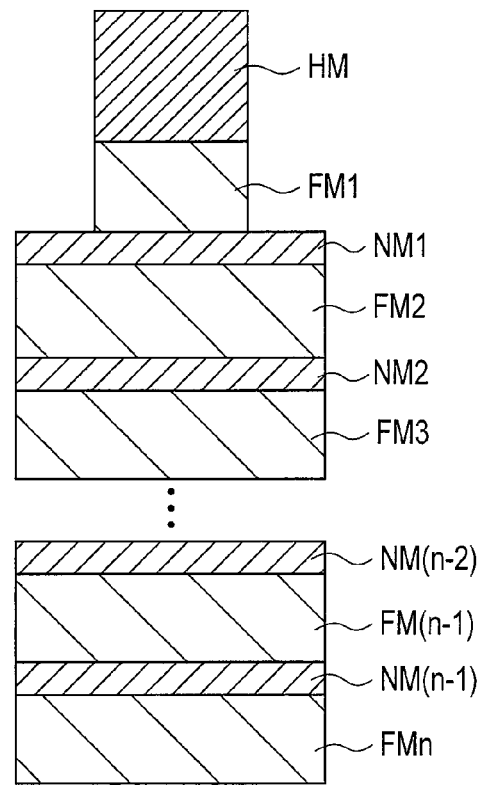

Next, uppermost magnetic layer FM1 is etched by chemical etching, for example, RIE using halogen gas, using mask layer HM as a mask until a top surface of non-magnetic layer NM1 is exposed, as shown in FIG. 2. After that, non-magnetic layer NM1 is etched by physical etching, for example, IBE, RIE using a noble gas such as Ar gas, etc. until a top surface of magnetic layer FM2 is exposed, and non-magnetic layer NM1 is re-deposited on side walls of second magnetic layer FM1, as shown in FIG. 3.

Figure 4:
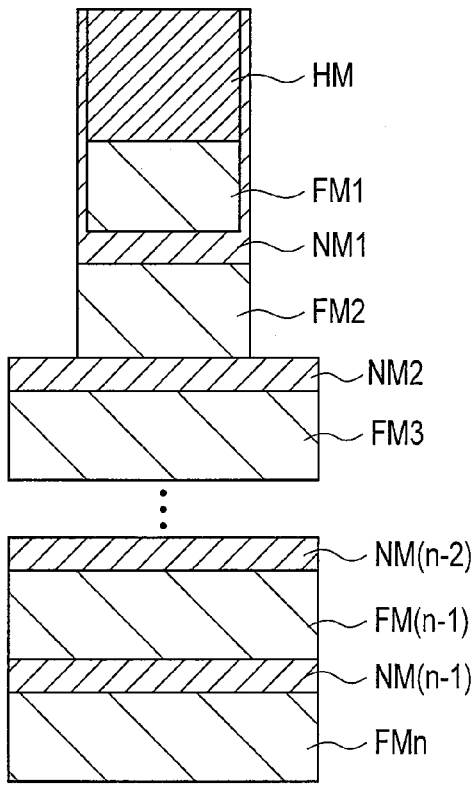

Next, magnetic layer FM2 is etched by chemical etching, for example, RIE using halogen gas in a state in which the side walls of magnetic layer FM1 are covered with non-magnetic layer NM1, until a top surface of non-magnetic layer NM2 is exposed, as shown in FIG. 4.

After that, non-magnetic layer NM2 is etched by physical etching, for example, IBE, RIE using a noble gas such as Ar until a top surface of magnetic layer FM3 is exposed, and non-magnetic layer NM2 is re-deposited on side walls of magnetic layer FM2, as shown in FIG. 5.

Figure 3:
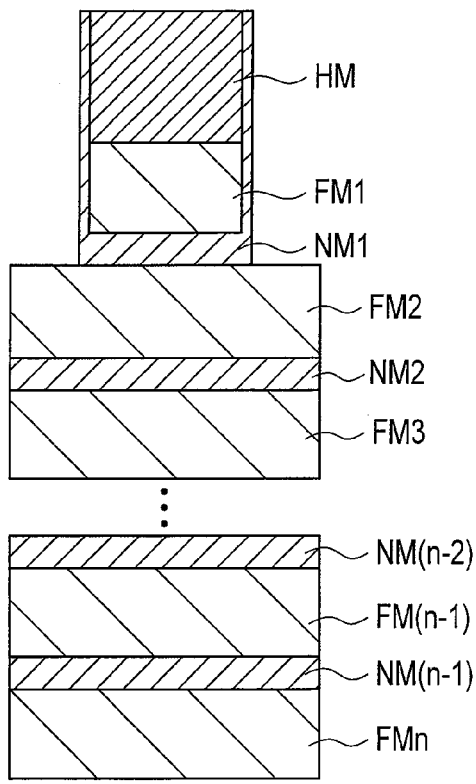

After that, etching of magnetic layer FM(n−1) based on chemical etching and etching of non-magnetic layer NM(n−1) based on physical etching are repeated, as shown in FIG. 6, similarly to the steps shown in FIG. 2 and FIG. 3 and the steps shown in FIG. 4 and FIG. 5. Both suppression of a chemical damage in each of the magnetic layers and fine processing can be thus implemented in the patterning of a magnetic element, for example, a magnetoresistive element, having a multilayered structure in which magnetic layers are stacked.

In the multilayered structure shown in FIG. 1 to FIG. 6, however, n is a natural number equal to or greater than 2. In other words, the chemical etching and the physical etching may be repeated at one or more times.

According to the above-described manufacturing method, when non-magnetic layer NM(n−1) is etched by the physical etching, the materials in non-magnetic layer NM(n−1) as evaporated once are re-deposited on at least side walls of magnetic layer FM(n−1) disposed immediately above the non-magnetic layer. For this reason, when magnetic layer FMn disposed immediately under non-magnetic layer NM(n−1) is etched by the chemical etching, the side walls of magnetic layer FM(n−1) are protected by non-magnetic layer NM(n−1).

Accordingly, even if the chemical etching using an etching gas having a great chemical reaction property such as halogen gas, which is excellent in, for example, etching anisotropy (fine processing), is used as the etching of magnetic layers FM1, FM2, . . . FMn, the chemical damage to magnetic layers FM1, FM2, . . . FMn is remarkably reduced as compared with prior art.

Conveniently, for example, all of magnetic layers FM1, FM2, ... FMn have been etched by the one-time chemical etching. For this reason, the time to contact the etching gas having the great chemical reaction property for each of magnetic layers FM1, FM2, ... FMn has been very long. In the First Embodiment, however, the time to contact the etching gas having the great chemical reaction property for each of magnetic layers FM1, FM2, ... FMn is approximately 1/n as compared with prior art.

Thus, according to the First Embodiment, since the time to contact the etching gas having the great chemical reaction property for each of magnetic layers FM1, FM2, ... FMn can be shortened as compared with that in prior art, fine processing can be implemented while suppressing the chemical damage to each of magnetic layers FM1, FM2, ... FMn in the patterning of a magnetic element, for example, a magnetoresistive element, comprising magnetic layers FM1, FM2, ... FMn.

It is desirable that each of non-magnetic layers NM1, NM2, ... NM(n–1) should have a thickness which does not affect a magnetic or electric characteristic of the magnetic element, for example, magnetoresistive element, for example, a thickness of not greater than 1 nm.

(Second Embodiment)

FIG. 7 shows a magnetoresistive element of Second Embodiment.

Underlayer UL is disposed on lower electrode LE. First magnetic layer 11 is disposed on underlayer UL. Non-magnetic layer (tunnel barrier layer) 12 is disposed on first magnetic layer 11. Second magnetic layer 13 is disposed on non-magnetic layer 12. Non-magnetic layer 14 is disposed on second magnetic layer 13. Shift cancel layer SCL is disposed on non-magnetic layer 14. Cap layer CAP is disposed on shift cancel layer SCL. Hard mask layer HM is disposed on cap layer CAP.

Non-magnetic layer 14 is disposed between second magnetic layer 13 and shift cancel layer SCL to cover side walls of hard mask layer HM, cap layer CAP and shift cancel layer SCL.

Side wall insulating layers (side wall mask layers) SWM are formed on non-magnetic layer 12 to cover side walls of hard mask layer HM, cap layer CAP, shift cancel layer SCL, non-magnetic layer 14 and second magnetic layer 13. Protective layer PL is formed on lower electrode LE to cover the magnetoresistive element.

One of first magnetic layer 11 and second magnetic layer 13 is a storage layer having variable magnetization while the other is a reference layer having invariable magnetization. First magnetic layer 11 and second magnetic layer 13 may be in a perpendicular magnetization type having perpendicular magnetization or an in-plane magnetization type having in-plane magnetization.

Shift cancel layer SCL can cancel a stray magnetic field from reference layer 13 applied to storage layer 11 when, for example, first magnetic layer 11 is a storage layer and second magnetic layer 13 is a reference layer. Therefore, for example, when the storage layer and the reference layer are in the perpendicular magnetization type, shift cancel layer SCL also comprises a magnetic layer in the perpendicular magnetization type.

The variable magnetization indicates that the direction of magnetization is variable to a predetermined write current, and the invariable magnetization indicates that the direction of magnetization is invariable to a predetermined write current.

First magnetic layer 11 and second magnetic layer 13 contain, for example, CoFeB. Shift cancel layer SCL contains, for example, any one of CoPt, CoFe, PtMn, and NiFe.

First magnetic layer 11, second magnetic layer 13 and shift cancel layer SCL may contain a disordered alloy, an artificial lattice, a ferrimagnet or a combination thereof.

(1) Examples of Disordered Alloy

Alloy containing cobalt (Co) as a main component and at least one element of chrome (Cr), tantalum (Ta), niobium (Nb), vanadium (V), tungsten (W), hafnium (Hf), titanium (Ti), zirconium (Zr), platinum (Pt), palladium (Pd), iron (Fe), and nickel (Ni).

For example, CoCr alloy, CoPt alloy, CoCrTa alloy, CoCrPt alloy, CoCrPtTa alloy, CoCrNb alloy, etc. are included in this group. In these alloys, a magnetic anisotropy energy density and a saturation magnetization are controlled, based on a rate of non-magnetic elements.

(2) Examples of Artificial Lattice

Laminate formed by alternately stacking two or more layers of a metal containing at least one element of iron (Fe), cobalt (Co) and nickel (Ni) and a metal containing at least one element of chrome (Cr), platinum (Pt), palladium (Pd), iridium (Ir), rhodium (Rh), ruthenium (Ru), osmium (Os), rhenium (Re), gold (Au), and copper (Cu).

For example, Co/Pt artificial lattice, Co/Pd artificial lattice, CoCr/Pt artificial lattice, Co/Ru artificial lattice, Co/Os artificial lattice, Co/Au, Ni/Cu artificial lattice, etc. are included in this group. In these materials, A/B indicates alternately stacking two or more layers of A and B. In these artificial lattices, the magnetic anisotropy energy density and the saturation magnetization are controlled, based on the type of the elements added to the magnetic layers, a ratio in thickness between the magnetic layers and the non-magnetic layers, and the like.

(3) Examples of Ferrimagnet

Alloy of rare-earth metals and transition metals, and amorphous alloys containing, for example, terbium (Tb), dysprosium (Dy) or gadolinium (Gd), and at least one element of transition metals.

For example, TbFe, TbCo, TbFeCo, DyTbFeCo, GdTbCo, etc. are included in this group. In these alloys, the magnetic anisotropy energy density and the saturation magnetization are controlled, based on a composition ratio.

Hard mask layer HM contains, for example, one of W, Ta, TaN, Ti, TiN, Ru, C (containing diamond-like carbon and graphite carbon), Al, AlN and AlO. Cap layer CAP contains, for example, one of Pt, W, Ta and Ru.

Non-magnetic layer 12 serving as a tunnel barrier layer is an insulator and contains, for example, one of MgO and AlO. Non-magnetic layer 14 is a conductor and a metal of the layer is selected from a group of materials which allows a re-deposition phenomenon to easily occur. Such materials are, for example, Ru, Pt, etc.

Underlayer UL contains, for example, one of Hf, AlN, and TaAlN, and lower electrode LE contains, for example, one of W, Ta, TaN, Ti, and TiN. Each of side wall insulating layers SWM and protective layer PL comprises an insulator layer of, for example, silicon nitride, silicon oxide, etc.

An interface layer (magnetic layer) may be disposed between non-magnetic layer 12 and second magnetic layer 13, in the second embodiment. However, the interface layer is designed to be sufficiently thinner than second magnetic layer 13.

In addition, in the second embodiment, the laminated structure on non-magnetic layer 12 serving as the tunnel barrier layer includes second magnetic layer 13, non-magnetic layer 14 and shift cancel layer SCL. However, shift cancel layer SCL may be a third magnetic layer different from shift cancel layer SCL. In other words, the laminated structure on non-magnetic layer 12 may be a structure of magnetic layer/non-magnetic layer/magnetic layer.

The structure shown in FIG. 7 is formed by, for example, a first patterning process using hard mask layer HM as a mask and a second patterning process using hard mask layer HM and side wall insulating layers SWM as masks.

In the first patterning process, cap layer CAP, shift cancel layer SCL, non-magnetic layer 14 and second magnetic layer 13 are etched. In the second patterning process, non-magnetic layer 12, first magnetic layer 11, and underlayer UL are etched. Protective layer PL is formed after the first and second patterning processes.

An example of a manufacturing method for obtaining the structure shown in FIG. 7 will be hereinafter described.

FIG. 8 to FIG. 14 show an example of the manufacturing method for obtaining the structure shown in FIG. 7.

First, underlayer UL is formed on lower electrode LE, first magnetic layer 11 is formed on underlayer UL, non-magnetic layer (tunnel barrier layer) 12 is formed on first magnetic layer 11, and second magnetic layer 13 is formed on non-magnetic layer 12, as shown in FIG. 8.

Subsequently, non-magnetic layer (conductor) 14 is formed on second magnetic layer 13, shift cancel layer SCL is formed on non-magnetic layer 14, cap layer CAP is formed on shift cancel layer SCL, and hard mask layer HM is formed on cap layer CAP.

Next, a first patterning process is executed by using hard mask layer HM as a mask. The first patterning process comprises first, second and third steps.

In the first step, cap layer CAP and shift cancel layer SCL are etched by predetermined etching using hard mask layer HM as the mask until a top surface of non-magnetic layer 14 is exposed, as shown in FIG. 9. The predetermined etching may be the chemical etching or may be the physical etching, for example, IBE.

In the second step, non-magnetic layer 14 is etched by the physical etching, for example, IBE until a top surface of second magnetic layer 13 is exposed, as shown in FIG. 10. At this time, the elements in non-magnetic layer 14 evaporated by the etching are deposited on side walls of hard mask layer HM, cap layer CAP and shift cancel layer SCL.

As a result, non-magnetic layer 14 covers the side walls of hard mask layer HM, cap layer CAP and shift cancel layer SCL, and functions as a protective layer of these layers.

In the present embodiment, non-magnetic layer 14 covers the side walls of hard mask layer HM, cap layer CAP and shift cancel layer SCL, but do not need to cover all of them. In other words, non-magnetic layer 14 may cover the magnetic layer which can be easily damaged by chemical etching to be described later, i.e., at least side walls of shift cancel layer SCL.

In the third step, second magnetic layer 13 is etched by the chemical etching, for example, RIE using halogen gas, using hard mask layer HM as a mask until the top surface of non-magnetic layer (tunnel barrier layer) 12 is exposed, as shown in FIG. 11.

Since second magnetic layer 13 alone has only to be etched in this etching, the etching of second magnetic layer 13 can be easily stopped when non-magnetic layer 12 is exposed. In other words, "stop on tunnel barrier" can be executed in the first patterning process.

In addition, since second magnetic layer 13 is thin, chemical damage to second magnetic layer 13 caused by the etching gas of the chemical etching is small.

The side walls of shift cancel layer SCL are covered with non-magnetic layer 14, in this etching. In other words, non-magnetic layer 14 functions as a protective layer configured to protect the shift cancel layer from the chemical damage caused by the etching gas of the chemical etching.

Therefore, shift cancel layer SCL does not suffer chemical damage by the chemical etching in the third step.

Next, an insulating layer (for example, silicon nitride) to cover hard mask layer HM, cap layer CAP, shift cancel layer SCL, non-magnetic layer 14 and second magnetic layer 13 is formed by, for example, CVD, as shown in FIG. 12.

Subsequently, side wall insulating layers (side wall mask layers) SWM to cover the side walls of hard mask layer HM, cap layer CAP, shift cancel layer SCL, non-magnetic layer 14 and second magnetic layer 13 are formed by etching the insulating layer by RIE.

Next, a second patterning process is executed by using hard mask layer HM and side wall insulating layers SWM as masks as shown in FIG. 13.

In the second etching process, non-magnetic layer 12, first magnetic layer 11 and underlayer UL are etched.

The second etching process executed by the chemical etching, physical etching or a combination thereof.

Finally, protective layer (for example, silicon nitride) PL to cover the magnetoresistive element is formed on lower electrode LE as shown in FIG. 14.

The structure shown in FIG. 7 is completed in the above-described steps.

According to the Second Embodiment, the time for which each of second magnetic layer 13 and shift cancel layer SCL to be in contact with the etching gas having a strong chemical reactivity in the patterning of the magnetoresistive element, can be shortened as compared with sequentially etching second magnetic layer 13 and shift cancel layer SCL by the chemical etching.

Therefore, fine processing of the magnetoresistive element can be implemented while suppressing the chemical damage to the magnetoresistive element, in the patterning of the magnetoresistive element.

(Third Embodiment)

Third Embodiment indicates an embodiment in which second magnetic layer 13 comprises first and second layers (magnetic layers) 13a and 13b, and non-magnetic layer 14' is disposed between first and second layers 13a and 13b in the Second Embodiment.

FIG. 15 shows a magnetoresistive element of the Third Embodiment.

Second magnetic layer 13 comprises first layer 13a on non-magnetic layer 12 serving as a tunnel barrier layer, non-magnetic layer 14' on first layer 13a, and second layer 13b on non-magnetic layer 14'. Non-magnetic layer 14 is disposed on second layer 13b in second magnetic layer 13, and shift cancel layer SCL is disposed on non-magnetic layer 14.

Non-magnetic layers 14 and 14' are conductors and contain materials which allow re-deposition to easily occur by the physical etching, for example, Ru, Pt, etc.

It is desirable that each of non-magnetic layers 14 and 14' should be set to have a thickness which does not affect a magnetic or electric characteristic of the magnetoresistive element, for example, a thickness of not greater than 1 nm.

Since the Third Embodiment is the same as the Second Embodiment in view of the other matters, the same elements as those of the structure shown in FIG. 7 are denoted by the same reference numbers and their detailed descriptions are omitted here.

FIG. 16 to FIG. 21 show an example of the manufacturing method for obtaining the structure shown in FIG. 15.

First, underlayer UL is formed on lower electrode LE, first magnetic layer 11 is formed on underlayer UL, non-magnetic layer (insulator) 12 is formed on first magnetic layer 11, first layer 13a is formed on non-magnetic layer 12, non-magnetic layer (conductor) 14' is formed on first layer 13a, and second layer 13b is formed on non-magnetic layer 14', as shown in FIG. 16.

Subsequently, non-magnetic layer (conductor) 14 is formed on second layer 13b, shift cancel layer SCL is formed on non-magnetic layer 14, cap layer CAP is formed on shift cancel layer SCL, and hard mask layer HM is formed on cap layer CAP.

Next, a first patterning process is executed. The first patterning process comprises first, second, third, fourth and fifth steps.

Figure 17:
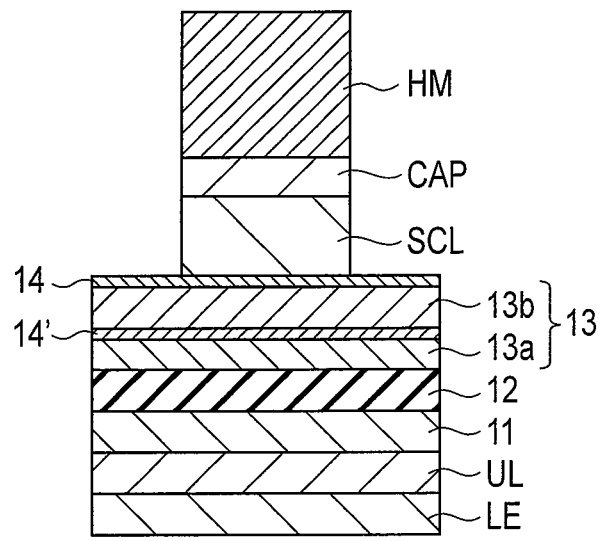

In the first step, cap layer CAP and shift cancel layer SCL are etched by predetermined etching using hard mask layer HM as the mask until a top surface of non-magnetic layer 14 is exposed, as shown in FIG. 17. The predetermined etching may be chemical etching or may be the physical etching, for example, IBE.

Figure 18:
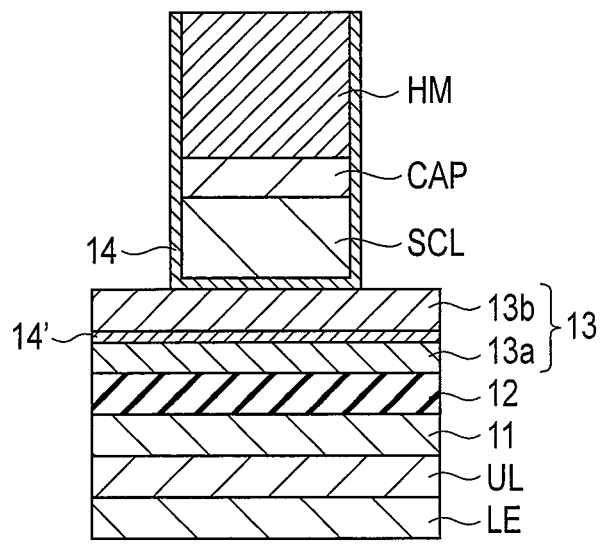

In the second step, non-magnetic layer 14 is etched by physical etching, for example, IBE until a top surface of second layer 13b is exposed, as shown in FIG. 18. In this etching, non-magnetic layer 14 is deposited on side walls of hard mask layer HM, cap layer CAP and shift cancel layer SCL, on the same principle as the Second Embodiment.

Non-magnetic layer 14 therefore covers the side walls of hard mask layer HM, cap layer CAP and shift cancel layer SCL or, at least the side walls of shift cancel layer SCL.

In the third step, second layer 13b is etched by chemical etching, for example, RIE using halogen gas until a top surface of non-magnetic layer 14' is exposed, as shown in FIG. 19.

Since second layer 13b alone has only to be etched in this etching, the etching of second layer 13b can be easily stopped when non-magnetic layer 14' is exposed. In addition, since second layer 13b is thin, chemical damage to second layer 13b is small.

The side walls of shift cancel layer SCL are covered with non-magnetic layer 14, in this etching. In other words, non-magnetic layer 14 functions as a protective layer configured to protect shift cancel layer from the chemical damage caused by the etching gas of the chemical etching.

Shift cancel layer SCL therefore does not suffer the chemical damage by the chemical etching in the third step.

In the fourth step, non-magnetic layer 14' is etched by the physical etching, for example, IBE using hard mask layer HM as a mask until a top surface of first layer 13a is exposed, as shown in FIG. 20. In this etching, non-magnetic layer 14' is deposited on the side walls of hard mask layer HM, cap layer CAP, shift cancel layer SCL and second layer 13b, based on the same principle as the principle of the Second Embodiment.

Non-magnetic layer 14' therefore covers the side walls of hard mask layer HM, cap layer CAP, shift cancel layer SCL and second layer 13b or, at least the side walls of second layer 13b.

In the fifth step, first layer 13a is etched by the chemical etching, for example, the RIE using halogen gas, using hard mask layer HM as a mask until a top surface of non-magnetic layer (tunnel barrier layer) 12 is exposed, as shown in FIG. 21.

Since second magnetic layer 13b alone has only to be etched in this etching, the etching of first layer 13a can be easily stopped ("stop on tunnel barrier") when non-magnetic layer 12 is exposed.

In addition, since first layer 13a is thin, chemical damage to first layer 13a is small.

The side walls of shift cancel layer SCL and second layer 13b are covered with non-magnetic layers 14 and 14', in this etching. In other words, Non-magnetic layers 14 and 14' function as protective layers configured to protect shift cancel layer and second layer 13b from the chemical damage caused by the etching gas of the chemical etching.

Shift cancel layer SCL and second layer 13b therefore do not suffer the chemical damage by the chemical etching in the fifth step.

Since steps subsequent to this are the same as those in the Second Embodiment (cf. FIG. 12 to FIG. 14), descriptions of the steps are omitted here.

The structure shown in FIG. 15 is completed in the above-described steps.

According to the Third Embodiment, the time for each of first layer 13a, second layer 13b and shift cancel layer SCL to be in contact with the etching gas having a strong chemical reactivity in the patterning of the magnetoresistive element, can be shortened as compared with sequentially etching first layer 13a, second layer 13b and shift cancel layer SCL by the chemical etching.

Therefore, fine processing of the magnetoresistive element can be implemented while suppressing the chemical damage to the magnetoresistive element, in the patterning of the magnetoresistive element.

(Fourth Embodiment)

The First to Third Embodiments propose technology for implementing both fine processing and high reliability (suppression of chemical damage) of the magnetic layer, in the first patterning process, i.e., the patterning of the magnetic layer on the tunnel barrier layer.

On the other hand, Fourth Embodiment proposes technology for implementing both fine processing and high reliability (suppression of chemical damage) of a magnetic layer, in the second patterning process, i.e., patterning of the magnetic layer under the tunnel barrier layer.

The Fourth Embodiment can be combined with one of the First to Third Embodiments. To simplify descriptions, a non-magnetic layer provided to prevent damage caused by chemical etching is not disposed in or on second magnetic layer 13.

FIG. 22 shows a magnetoresistive element of the Fourth Embodiment.

Underlayer UL is formed on lower electrode LE, first magnetic layer 11 is formed on underlayer UL, non-magnetic layer (tunnel barrier layer) 12 is formed on first magnetic layer 11.

Lower electrode LE is a conductor and contains materials which allow re-deposition to easily occur by the physical etching, for example, Ru, Pt, etc. Lower electrode LE covers side walls of underlayer UL and first magnetic layer 11.

Second magnetic layer 13 is disposed on non-magnetic layer 12, shift cancel layer SCL is disposed on second magnetic layer 13, cap layer CAP is disposed on shift cancel layer SCL, and hard mask layer HM is disposed on cap layer CAP.

Side wall insulating layers (side wall mask layers) SWM are formed on non-magnetic layer 12 to cover the side walls of hard mask layer HM, cap layer CAP, shift cancel layer SCL, non-magnetic layer 14 and second magnetic layer 13. Protective layer PL is formed on lower electrode LE to cover the magnetoresistive element.

Since the Fourth Embodiment is the same as the Second Embodiment in view of the other matters, the same elements as those of the structure shown in FIG. 7 are denoted by the same reference numbers and their detailed descriptions are omitted here.

FIG. 23 to FIG. 27 show an example of the manufacturing method for obtaining the structure shown in FIG. 22.

First, underlayer UL is formed on lower electrode LE, first magnetic layer 11 is formed on underlayer UL, non-magnetic layer (insulator) 12 is formed on first magnetic layer 11, and second magnetic layer 13 is formed on non-magnetic layer 12, as shown in FIG. 23.

Subsequently, shift cancel layer SCL is formed on second magnetic layer 13, cap layer CAP is formed on shift cancel layer SCL, and hard mask layer HM is formed on cap layer CAP.

Next, a first patterning process using hard mask layer HM as a mask is executed.

In the first patterning process, cap layer CAP, shift cancel layer SCL, and second magnetic layer 13 are etched by chemical etching, physical etching or a combination thereof until a top surface of non-magnetic layer (insulator) 12 is exposed, as shown in FIG. 24.

Next, an insulating layer (for example, silicon nitride) to cover hard mask layer HM, cap layer CAP, shift cancel layer SCL, and second magnetic layer 13 is formed by, for example, CVD, as shown in FIG. 25.

Subsequently, side wall insulating layers (side wall mask layers) SWM to cover the side walls of hard mask layer HM, cap layer CAP, shift cancel layer SCL, and second magnetic layer 13 are formed by etching the insulating layer by RIE.

After that, a second patterning process is executed by using hard mask layer HM and side wall mask layers SWM as masks.

The second patterning process comprises first, second and third steps.

In the first step, non-magnetic layer 12, first magnetic layer 11 and underlayer UL are etched by predetermined etching as shown in FIG. 25.

The predetermined etching may be the chemical etching or may be the physical etching, for example, IBE.

In the second step, the layers are etched up to a top portion of lower electrode LE, i.e., a middle level of lower electrode LE by the physical etching, for example, IBE, as shown in FIG. 26. At this time, elements in lower electrode LE evaporated by the etching are deposited on side walls of each of underlayer UL and first magnetic layer 11.

Lower electrode LE therefore functions as at least a protective layer covering side walls of underlayer UL and first magnetic layer 11.

In the third step, a lower portion of lower electrode LE, i.e., a remaining portion of lower electrode LE is etched by the chemical etching, for example, RIE using halogen gas, as shown in FIG. 27.

The side walls of underlayer UL and first magnetic layer 11 are covered with lower electrode LE, in the etching. For this reason, underlayer UL and first magnetic layer 11 do not suffer chemical damage by the etching.

Finally, the structure shown in FIG. 22 is completed by forming protective layer PL.

Thus, according to the Fourth Embodiment, even if a portion of lower electrode LE is etched by the chemical etching, at least the side walls of first magnetic layer 11 are covered with lower electrode LE at the etching time.

Therefore, fine processing of the magnetoresistive element can be implemented while suppressing the chemical damage to the magnetoresistive element, in the patterning of the magnetoresistive element.

(Fifth Embodiment)

In Fifth Embodiment, an example of a manufacturing apparatus for executing the first or second patterning process of the First to Fourth Embodiments will be described.

In the First to Fourth Embodiments, the first or second patterning process comprises at least two steps. To execute the at least two steps, the manufacturing apparatus comprises, for example, first chamber C1 in which physical etching is executed and second chamber C2 in which RIE is executed, as shown in, for example, FIG. 28. In other words, the manufacturing methods of the First to Fourth Embodiments can be executed in a multi-chamber shown in FIG. 28.

In the multi-chamber, the magnetoresistive element (wafer) can be conveyed between first chamber C1 and second chamber C2 in a state in which the magnetoresistive element is not exposed to air, i.e., the magnetoresistive element is not oxidized.

FIG. 29 shows an example of a chamber in which the RIE is executed.

Wafer 33 is arranged on wafer table (electrode) 32 in chamber 31. A noble gas and halogen gas are supplied from gas suppliers 34 and 35, respectively, into chamber 31 through gas pipe 37. These gases evenly spread on wafer 33 by shower plate (electrode) 38.

A pressure in chamber 31 is measured by pressure gauge 39. High-frequency power supplies 40 and 41 are connected to wafer table 32 and shower plate 38, respectively.

Then, the RIE is executed by generating plasma from an etching gas in chamber 31 and accelerating ions of the etching gas toward wafer 33 while controlling electric power of high-frequency power supplies 40 and 41 and the pressure in chamber 31.

If, for example, a noble gas is supplied into chamber 31, in such a chamber, RIE (physical etching) using the noble gas can be executed. In addition, if, for example, halogen gas is supplied into chamber 31, in such a chamber, RIE (physical etching) using the halogen gas can be executed.

(Example of Application)

Application of the magnetoresistive element of the above-described embodiments to a magnetic random access memory will be described here.

A 1T-1MTJ type memory cell array wherein a memory cell comprises a magnetoresistive element and a select transistor will be hereinafter described as one of examples of application.

FIG. 30 shows an example of an equivalent circuit of the 1T-1MTJ type memory cell array.

Memory cell array 10 comprises arrayed memory cells MC. Each of memory cells MC comprises magnetoresistive element MTJ and select transistor (FET) SW.

Magnetoresistive element MTJ and select transistor SW are serially connected, each having an end connected to first bit line BL1 and the other end connected to second bit line BL2. A control terminal (gate terminal) of select transistor SW is connected to word line EL.

First bit line BL1 extends in a first direction, having an end connected to bit line driver/sinker 15. Second bit line BL2 extends in the first direction, having an end connected to bit line driver/sinker and read circuit 16.

However, the circuit can be modified to connect first bit line BL1 to bit line driver/sinker and read circuit 16 and to connect second bit line BL2 to bit line driver/sinker 15.

In addition, bit line driver/sinker 15 and bit line driver/sinker and read circuit 16 may be disposed at positions opposite to each other or the same position.

Word line WL extends in a second direction, having an end connected to word line driver 17.

FIG. 31 shows an example of the memory cell.

Select transistor SW is disposed in active area AA in semiconductor substrate 18. Active area AA is surrounded by element isolating/insulating layer 19 in semiconductor substrate 18. In this example, element isolating/insulating layer 19 has an STI (Shallow Trench Isolation) structure.

Select transistor SW comprises source/drain diffusion layers 20a and 20b in semiconductor substrate 18, gate insulation layer 21 on a channel between the layers, and gate electrode 22 on gate insulation layer 21. Gate electrode 22 functions as word line WL.

Interlayer insulation layer 23 covers select transistor SW. A top surface of interlayer insulation layer 23 is flat, and lower electrode LE is disposed on interlayer insulation layer 23. Lower electrode LE is connected to source/drain diffusion layer 20b of select transistor SW via contact plug 24.

Magnetoresistive element MTJ is disposed on lower electrode LE. Upper electrode 25 is disposed on magnetoresistive element MTJ. Upper electrode 25 functions as, for example, hard mask HM to be used for processing of magnetoresistive element MTJ.

Protective layer PL covers the side walls of magnetoresistive element MTJ.

Interlayer insulation layer 26 is disposed on protective layer PL to cover magnetoresistive element MTJ. A top surface of interlayer insulation layer 26 is flat and first bit line BL1 and second bit line BL2 are disposed on interlayer insulation layer 26. First bit line BL1 is connected to upper electrode 25. Second bit line BL2 is connected to source/drain diffusion layer 20a of select transistor SW via contact plug 27.

CONCLUSION

According to the above-described embodiments, both the suppression of chemical damage and the fine processing can be implemented by combining the chemical etching and the physical etching, at the patterning of the magnetoresistive element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiment described herein may be made without departing from the spirit of the invention. The accompanying claims and their equivalents are intended to cover such forms or modifications as would fall within the scope and spirit of the inventions.

What is claimed is:

1. A magnetic element comprising:
   a first magnetic layer;
   a first non-magnetic layer on the first magnetic layer;
   a second magnetic layer on the first non-magnetic layer;
   a second non-magnetic layer on the second magnetic layer; and
   a third magnetic layer on the second non-magnetic layer, wherein the third magnetic layer has a side wall layer comprising a material which is included in the second non-magnetic layer,
   wherein the material is one of Ru and Pt as a common material to the side wall layer and the second non-magnetic layer, and
   wherein the side wall layer is directly contacting the third magnetic layer.

2. The element of claim 1, wherein the side wall layer of the third magnetic layer and the second non-magnetic layer are physically continued.

3. The element of claim 1, wherein the first magnetic layer is a storage layer with a perpendicular magnetization perpendicular to a surface of the first magnetic layer and variable magnetization, and
   wherein the second magnetic layer is a reference layer with a perpendicular magnetization perpendicular to a surface of the second magnetic layer and invariable magnetization.

4. The element of claim 3, wherein the third magnetic layer is a shift cancel layer with a perpendicular magnetization perpendicular to a surface of the third magnetic layer and invariable magnetization.

5. A magnetic element comprising:
   an electrode;
   a first magnetic layer on the electrode, wherein the first magnetic layer has a side wall layer comprising a material which is included in the electrode;
   a non-magnetic layer on the first magnetic layer; and
   a second magnetic layer on the non-magnetic layer;
   wherein the material is one of Ru and Pt as a common material to the side wall layer and the electrode; and
   wherein the side wall layer is directly contacting the first magnetic layer.

6. The element of claim 5, wherein the side wall layer of the first magnetic layer and the electrode are physically continued.

7. The element of claim 5, further comprising a foundation layer between the electrode and the first magnetic layer.

8. The element of claim 5, wherein the first magnetic layer is a storage layer with a perpendicular magnetization perpendicular to a surface of the first magnetic layer and variable magnetization, and
   wherein the second magnetic layer is a reference layer with a perpendicular magnetization perpendicular to a surface of the second magnetic layer and invariable magnetization.

9. The element of claim 8, further comprising a shift cancel layer on the second magnetic layer, wherein the shift cancel layer has a perpendicular magnetization perpendicular to a surface of the shift cancel layer and invariable magnetization.

* * * * *